United States Patent
Iida et al.

(10) Patent No.: US 8,779,855 B2
(45) Date of Patent: Jul. 15, 2014

(54) POWER AMPLIFICATION CIRCUIT HAVING TRANSFORMER

(71) Applicant: Renesas Electronics Corporation, Kawasaki (JP)

(72) Inventors: Tetsuya Iida, Kanagawa (JP); Akihiko Furukawa, Kanagawa (JP); Satoshi Yamakawa, Kanagawa (JP); Tsuyoshi Kawakami, Kanagawa (JP); Masao Kondo, Kanagawa (JP); Yutaka Hoshino, Kanagawa (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 13/904,788

(22) Filed: May 29, 2013

(65) Prior Publication Data

US 2013/0265109 A1    Oct. 10, 2013

Related U.S. Application Data

(63) Continuation of application No. 13/675,820, filed on Nov. 13, 2012, now Pat. No. 8,461,927, which is a continuation of application No. 13/367,121, filed on Feb. 6, 2012, now Pat. No. 8,330,544, which is a continuation of application No. 12/617,488, filed on Nov. 12, 2009, now Pat. No. 8,134,408.

(30) Foreign Application Priority Data

Dec. 12, 2008   (JP) ................................. 2008-316891

(51) Int. Cl.
*H03F 3/26*    (2006.01)

(52) U.S. Cl.
USPC .......................................... 330/276; 330/255

(58) Field of Classification Search
USPC ......... 330/126, 195, 255, 276, 295, 262–264, 330/269
See application file for complete search history.

(56) References Cited

U.S. PATENT DOCUMENTS

| 5,742,205 | A | 4/1998 | Cowen et al. | |
|---|---|---|---|---|
| 6,816,012 | B2* | 11/2004 | Aoki et al. | 330/276 |
| 7,372,336 | B2 | 5/2008 | Lee et al. | |
| 7,425,769 | B2 | 9/2008 | Roh | |
| 7,425,869 | B2* | 9/2008 | Aoki et al. | 330/276 |

(Continued)

FOREIGN PATENT DOCUMENTS

| JP | 5-88018 U | 11/1993 |
|---|---|---|
| JP | 08-222436 A | 8/1996 |

(Continued)

OTHER PUBLICATIONS

Japanese Office Action, and English translation thereof, issued in Japanese Patent Application No. 2008-316891 dated Sep. 4, 2012.

(Continued)

*Primary Examiner* — Khanh V Nguyen
(74) *Attorney, Agent, or Firm* — McDermott Will & Emery LLP

(57) ABSTRACT

In order to realize a wider bandwidth of a frequency characteristic of a power amplification circuit, outputs of differential push-pull amplifiers which are matched at respectively different frequencies are combined together by secondary inductors, and the combined signal is outputted.

4 Claims, 9 Drawing Sheets

(56) References Cited

U.S. PATENT DOCUMENTS

| | | | |
|---|---|---|---|
| 7,834,686 | B2 | 11/2010 | Staszewski et al. |
| 8,093,950 | B2 | 1/2012 | Furukawa et al. |
| 2006/0232355 | A1 | 10/2006 | Park et al. |

FOREIGN PATENT DOCUMENTS

| | | |
|---|---|---|
| JP | 2002-515196 A | 5/2002 |
| JP | 2005-503679 A | 2/2005 |
| JP | 2005-109651 A | 4/2005 |
| JP | 2006-295896 A | 10/2006 |
| JP | 2008-263432 A | 10/2008 |
| WO | 02/31967 A2 | 4/2002 |

OTHER PUBLICATIONS

Jongchan Kang et al., "A Single-Chip Linear CMOS Power Amplifier for 2.4 GHz WLAN," International Solid-State Circuits Conference 2006, Digest of Technical Papers, pp. 208-209, 649, Feb. 2006.

* cited by examiner

POWER AMPLIFICATION CIRCUIT HAVING TRANSFORMER

RELATED APPLICATIONS

This application is a Continuation of U.S. application Ser. No. 13/675,820, filed on Nov. 13, 2012, which is a Continuation of U.S. application Ser. No. 13/367,121, filed on Feb. 6, 2012 (now U.S. Pat. No. 8,330,544) which is a Continuation of U.S. application Ser. No. 12/617,488 filed on Nov. 12, 2009 (now U.S. Pat. No. 8,134,408), which in turn claims the benefit of Japanese Application No. 2008-316891, filed on Dec. 12, 2008, the disclosures of which Applications are incorporated by reference in its entirety.

BACKGROUND OF THE INVENTION

The present invention relates to a power amplification circuit, in particular to a power amplification circuit having a wide band frequency characteristic.

A power amplification circuit performs a power amplification of a weak signal to a necessary level, and outputs the amplified signal. For example in wireless communication use as exemplified by a portable device, such a power amplification circuit is utilized in order to amplify a weak high frequency signal to a signal with a sufficient power which a wireless system requires in outputting.

One example of the power amplification circuit includes a differential push-pull method. A power amplification circuit according to the differential push-pull method combines by a combiner a differential signal amplified by a pair of transistors, and generates an output signal. Since a differential signal is utilized, an output twice as high in amplitude as an output signal of a single transistor is obtained, and in addition, even harmonics are balanced out. Therefore, the differential push-pull method provides a means effective in realizing an amplification circuit of high power and low distortion.

In mobile communications fields as typified by a mobilephone, realization of low cost when practicing reduction of occupied area is an important subject. Therefore, as a component transistor, a miniaturized CMOS transistor (complementary insulated-gate field effect transistor) is utilized, and as a combiner in a microwave region, a transformer is used frequently. An example of configuration of a differential push-pull amplifier utilizing such miniaturizing CMOS process is described in Non Patent Literature 1 (Jongchan Kang, et al., "A single-chip linear CMOS power amplifier for 2.4 GHz WLAN", International Solid-State Circuits Conference 2006, Digest of Technical Papers, pp. 761-769, February 2006).

In the configuration of the power amplifier illustrated in Non Patent Literature 1, a transformer which serves as a combiner includes a primary slab inductor and a secondary slab inductor, having a half-turn winding, respectively. Both ends of the primary metal slab are driven by one pair of MOS transistors which receive a differential signal. In Non Patent Literature 1, the primary inductor and secondary inductor of the transformer have respective inductors of a half-turn winding, and improvement of conversion efficiency (a ratio of output power Pout to input power Pin, Pout/Pin) is promoted by reducing cancellation of magnetic flux from an opposing side.

Patent Literature 1 (Japanese Unexamined Patent Application Publication (Translation of PCT application) No. 2005-503679) discloses configuration of a power amplification circuit using a differential push-pull amplifier aiming at lowloss, a small area, and high power. In the configuration disclosed by Patent Literature 1, outputs of plural differential push-pull amplifiers are combined together by a transformer, thereby realizing a several-Watt-class output with the use of miniaturized CMOS transistors. Specifically, in Patent Literature 1, the secondary inductors of the transformer are coupled in series, and the outputs of four differential push-pull amplifiers are combined together. Each of the secondary inductors performs impedance conversion and provides low output impedance to a drain of a transistor of each push-pull amplifier. Accordingly, drain voltage is suppressed low and high-output power is realized. The primary inductor and secondary inductor of the transformer are respectively formed in a slab shape, and the transformer is arranged to form a circular geometry. Accordingly, a power amplification circuit with low loss and small area is realized.

Patent Literature 2 (Japanese Unexamined Patent Publication No. 2006-295896) discloses configuration of a power amplifier aiming at improvement of the efficiency and operation region of the power amplifier. In the configuration disclosed by Patent Literature 2, a transmission line transformer used as a matching circuit of the power amplifier utilizes a primary transmission line (inductor) of a different shape. That is, primary inductors with a different shape and a different parasitic component are arranged on both sides of a secondary inductor of the transformer, and a differential push-pull amplifier is coupled to each of the primary inductors. The primary inductors are switched so that load resistance may be small when generating a high-output power, and the load resistance may be large when generating a low-output power. In Patent Literature 2, improvement of the efficiency and operation region (dynamic range) of the entire power amplification circuit are promoted by providing different output load to two differential push-pull amplifiers.

(Patent Literature 1) Japanese Unexamined Patent Publication No. 2005-503679

(Patent Literature 2) Japanese Unexamined Patent Publication No. 2006-295896

(Non Patent Literature 1) Jongchan Rang, et al., "A singlechip linear CMOS power amplifier for 2.4 GHz WLAN", International Solid-State Circuits Conference 2006, Digest of Technical Papers, pp. 761-769, February 2006.

SUMMARY OF THE INVENTION

In the mobile communications field, a power amplifier is used in a transmission system requiring high power and low distortion. However, in the mobile communications field, various telecommunications standards exist, and a group of various radio transmission parameters (a frequency band, bandwidth, a modulation method, a necessary signal-to-noise ratio, etc.) are specified; accordingly it is required to set up necessary parameters corresponding to each specification. In particular, in a telecommunications standard with a broad frequency-band modulation and in an international standard specification according to a telecommunications standard of each country, it is required to maintain high power over a wide band. However, a high power CMOS transistor generally tends to have a narrow band frequency characteristic, since the output impedance of the high power CMOS transistor is low and output matching is provided using a matching circuit. When using a CMOS differential push-pull amplifier disclosed by Patent Literature 1 or Patent Literature 2, or illustrated by Non Patent Literature 1, a narrow band frequency characteristic is obtained similarly. In Patent Literature 1 and Patent Literature 2 and Non Patent Literature 1, no consideration is taken about configuration which provides a wide band frequency characteristic.

Accordingly, an object of the present invention is to provide a power amplification circuit having a wide band frequency characteristic.

Another object of the present invention is to realize a power amplification circuit having a wide band frequency characteristic by employing a power amplifier which exhibits a narrow band frequency characteristic.

A power amplification circuit according to the present invention includes plural differential push-pull amplifiers matched respectively to different frequencies, and all the outputs of the plural differential push-pull amplifiers are combined together by a secondary inductor of a transformer.

The outputs of the plural differential push-pull amplifiers are combined together by the secondary inductor, and can maintain high power in a frequency band specified by the respectively different matching frequencies of the differential push-pull amplifiers. Accordingly, it is possible to realize a power amplification circuit which exhibits a flat frequency characteristic over a wide band.

DETAILED DESCRIPTION OF THE PREFERRED EMBODIMENTS

Embodiment 1

Figure 1:
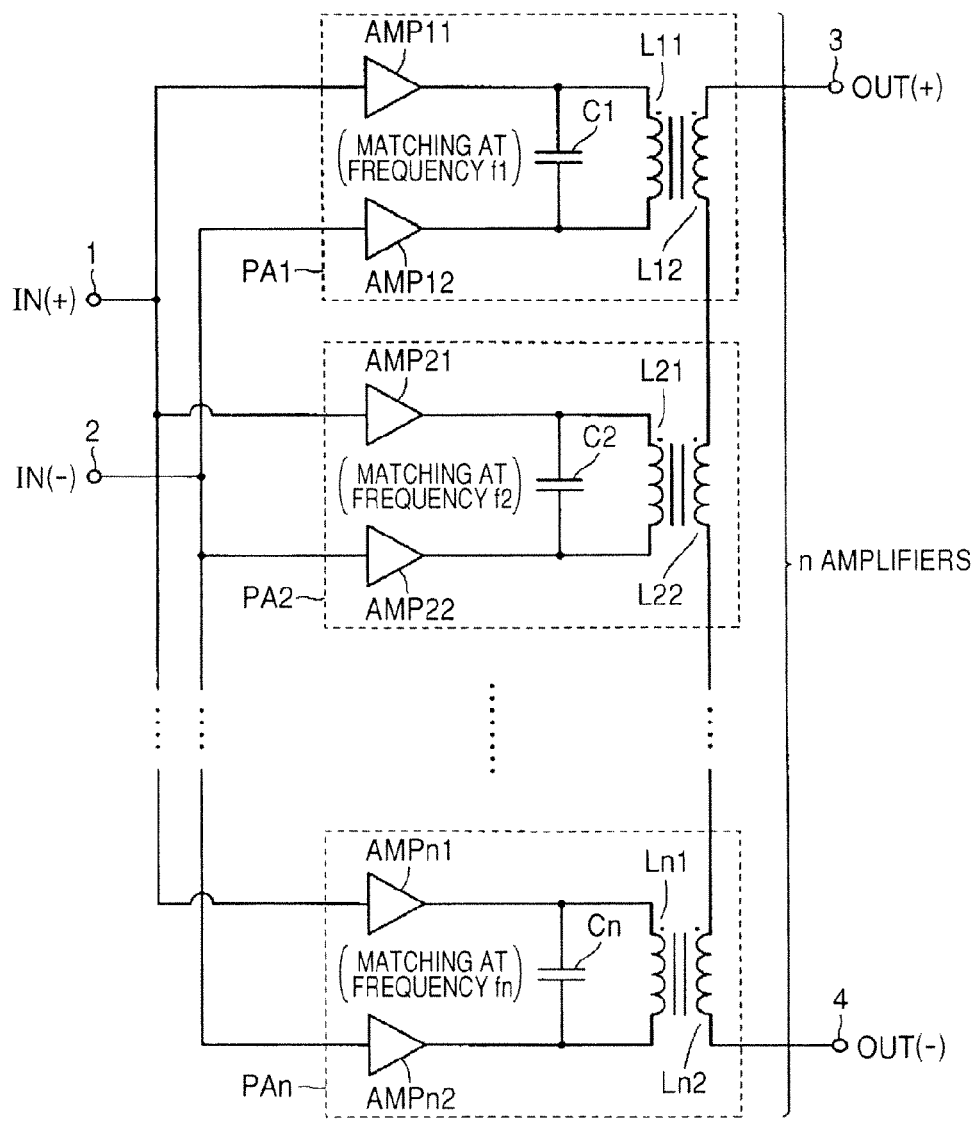
FIG. 1 is a drawing illustrating schematically configuration of a power amplification circuit according to Embodiment 1 of the present invention.

FIG. 1 illustrates configuration of a power amplification circuit according to Embodiment 1 of the present invention.

In FIG. 1, differential input signals IN(+) and IN(−) are supplied to input terminals 1 and 2, respectively. Differential push-pull amplifiers PA1-PAn are coupled in parallel to the input terminals 1 and 2. The differential push-pull amplifiers PA1-PAn are respectively matched at different frequencies f1, f2, . . . fn. Here the frequencies f1, f2, fn satisfy the relationship of f1<f2< . . . <fn.

Each of the differential push-pull amplifiers PA1-PAn includes amplifiers which are provided corresponding to the respective input terminals 1 and 2, and a parallel resonant circuit of a capacitor and a primary inductor, which performs matching of the outputs of the amplifiers. Specifically, the differential push-pull amplifier PA1 includes amplifiers AMP11 and AMP12 which are provided to the input terminals 1 and 2, respectively, and a capacitor C1 and a primary inductor L11 which are coupled in parallel between outputs of the amplifiers AMP11 and AMP12. The differential push-pull amplifier PA2 includes amplifiers AMP21 and AMP22 which are provided to the input terminals 1 and 2, respectively, and a capacitor C2 and a primary inductor l21 which are coupled in parallel between outputs of the amplifiers AMP21 and AMP22. The differential push-pull amplifier PAn includes amplifiers AMPn1 and AMPn2 which are provided to the input terminals 1 and 2, respectively, and a capacitor Cn and a primary inductor Ln1 which are coupled in parallel between outputs of the amplifiers AMPn1 and AMPn2.

In a differential push-pull amplifier PAi (i=1, . . . n), a matching frequency of amplifiers AMPi1 and AMPi2 is determined by a parallel resonant circuit of a capacitor Ci and a primary inductor Li1.

Secondary inductors L12, L22-Ln2 are provided in opposed positions to the primary inductors L11, L21-Ln1 of the differential push-pull amplifiers PA1, PA2-PAn, respectively. The secondary inductors L12-Ln2 are coupled in series between output terminals 3 and 4. Differential output signals OUT (+) and OUT (−) are outputted from the output terminals 3 and 4. Here, the symbols (+), (−) of the differential output signal define the amplifiers AMP11, AMP12-AMPn1, AMPn2 as a non-inverting amplifier (positive phase amplifier). A single phase signal can be outputted from one output terminal of the output terminals 3 and 4 by grounding the other output terminal.

The primary inductors L11-Ln1 and the corresponding secondary inductors L12-Ln2 are included respectively in a transformer which performs impedance matching and impedance conversion. The so-called "the polarity of a coil (indicated by a black dot)" of the primary inductors L11-Ln1 and the secondary inductors L12-Ln2 is the same. Therefore, the secondary inductors L12-Ln2 are coupled in series between the output terminals 3 and 4, and secondary signals are respectively generated by magnetic coupling between the primary inductors L11-Ln1 and the corresponding secondary inductors L12-Ln2 of the differential push-pull amplifiers PA1-PAn, and combined together by the secondary inductors L12-Ln2. Accordingly, the combined signal is outputted to the output terminals 3 and 4.

The n differential push-pull amplifiers PA1-PAn are matched at mutually different frequencies f1-fn. The matching frequencies are respectively determined by capacitance of the corresponding capacitor Ci and inductance of the corresponding primary inductor Li1. Generally, in the differential push-pull amplifiers PAi and PAj (PAi and PAj are different with each other) among the differential push-pull amplifiers PA1-PAn, capacitance of the capacitor Ci and capacitance of the capacitor Cj differ with each other, and inductance of the primary inductor Li1 and inductance of the primary inductor Lj1 differ with each other.

When the amplifiers AMP11, AMP12-AMPn1, AMPn2 included in the differential push-pull amplifiers PA1-PAn have the same characteristic, inductance L and capacitance C necessary for matching have a tendency to become smaller as the matching frequency becomes higher.

Figure 2:
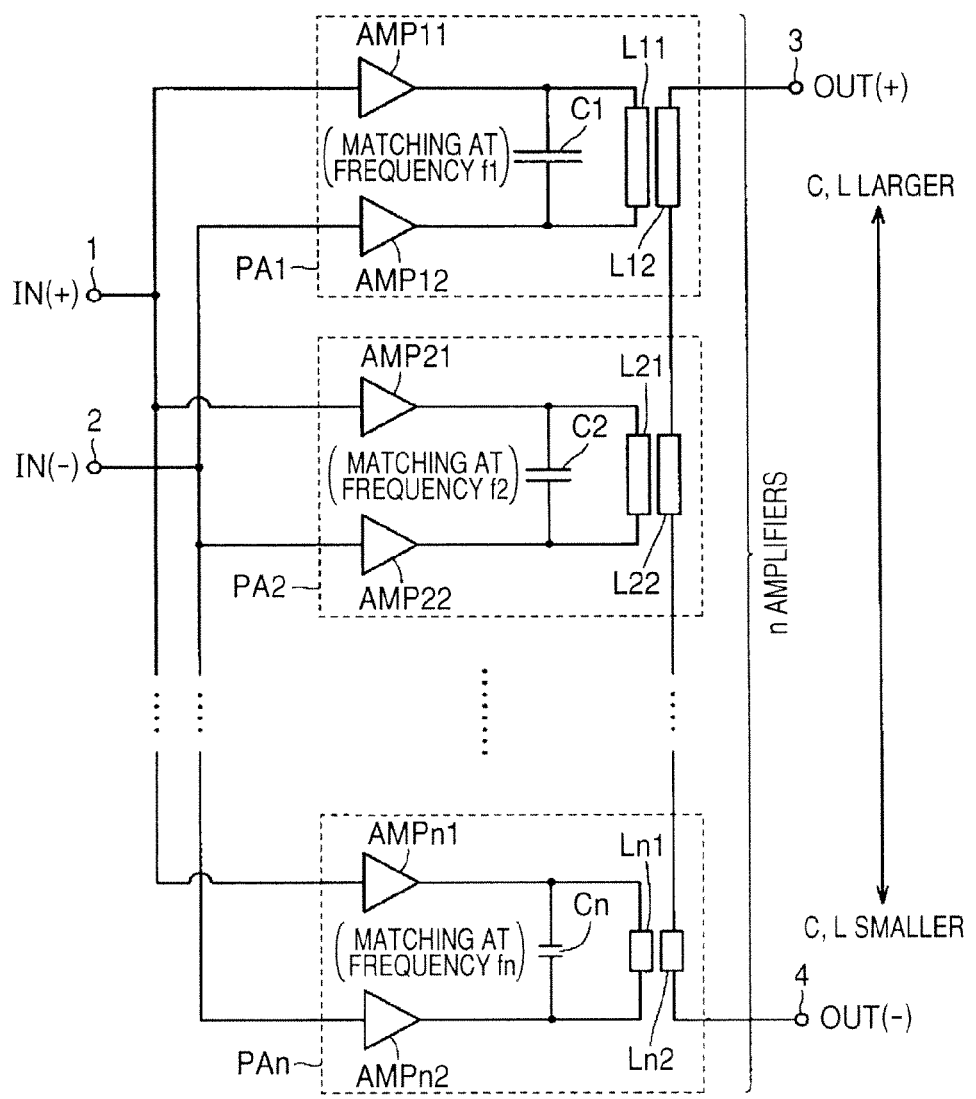
FIG. 2 is a drawing illustrating visually magnitude relation of LC components of the power amplification circuit illustrated in FIG. 1.

FIG. 2 illustrates schematically shapes of the capacitors C1-Cn and the primary inductors L11-Ln1 of a transformer included in the differential push-pull amplifiers PA1-PAn, so that the magnitude relation of the capacitance of the capacitors C1-Cn and the magnitude relation of the inductance of the primary inductors L11-Ln1 of the transformer can be understood visually. In FIG. 2, the magnitude of capacitance is indicated by the length of an opposing electrode and the magnitude of inductance is indicated by the length of an inductor.

In FIG. 2, the capacitors C1-Cn are formed from the same material and by the same process, and the capacitance thereof is proportional to an opposing area of the electrode. In FIG. 2, the opposing electrode area is indicated by the length of the electrode. When an inductor which is included in each transformer is formed from the same material and by the same process, the inductance of the primary inductors L11-Ln1 of the transformer increases monotonically with the length thereof, regardless of whether the inductor is formed by a coil or a metal slab. Therefore, as illustrated in FIG. 2, in the differential push-pull amplifier PA1 matched at the lowest frequency f1, the opposing electrode area of the capacitor C1 is the greatest, and the length of the primary inductor L11 of the transformer is the longest. As the matching frequency becomes higher, the opposing electrode area of the capacitors C2, Cn becomes smaller in order, and the length of the primary inductors L21, Ln1 of the transformer becomes shorter in order.

Therefore, when the amplifiers AMP11, AMP12-AMPn1, AMPn2 have the same characteristic, it is possible to realize the differential push-pull amplifiers which are matched at mutually different frequencies, by adjusting the opposing electrode area of the capacitor and the length of the primary inductor of the transformer.

In the configuration illustrated in FIG. 2, each of the secondary inductors L12-Ln2, arranged in opposed positions to the primary inductors L11-Ln1 of the transformer, is set as the same length as the corresponding primary inductor. In such a case, the turn ratio of each primary inductor to secondary inductor is set equivalently equal; accordingly, the impedance conversion ratio thereof is set to one. All impedance conversion ratios of the differential push-pull amplifiers PA1-PAn are made equal, and output signals, each matched to the output load in the secondary inductors L12-Ln2, can be combined together and the combined output signal can be generated at the output terminals 3 and 4. Accordingly, even in a case where frequency of the differential input signals IN(+) and IN(−) supplied to the input terminals 1 and 2 is different, it is possible to generate a large output signal by a differential push-pull amplifier which is matched to the frequency of the input signal, and it is also possible to obtain the frequency characteristic of the output signal which has peaks at frequencies f1-fn at which these differential push-pull amplifiers PA1-PAn are matched. Therefore, the frequency characteristic of a wider bandwidth can be realized.

Figure 3:
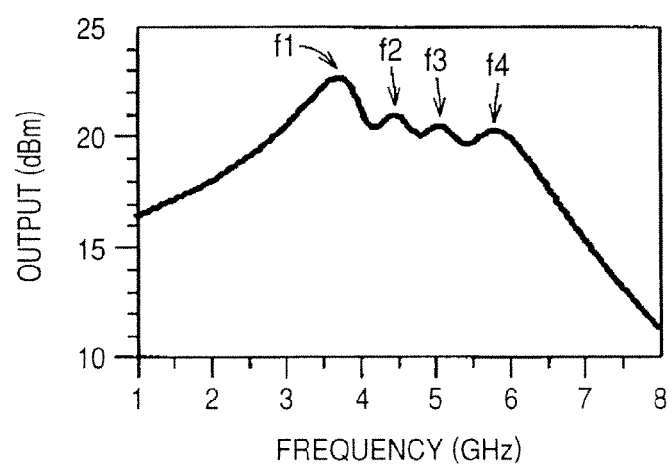
FIG. 3 is a drawing illustrating a simulation result of a frequency characteristic of the power amplification circuit according to Embodiment 1 of the present invention.

FIG. 3 illustrates a simulation result of a frequency characteristic of an output signal of the power amplification circuit according to Embodiment 1 of the present invention. FIG. 3 illustrates an output frequency characteristic in a case where four differential push-pull amplifiers (n=4) are provided. In FIG. 3, the horizontal axis indicates a frequency (in units of GHz), and the vertical axis indicates an output (in units of dBm).

As illustrated in FIG. 3, since the output signals of the differential push-pull amplifiers PA1-PA4 matched at frequencies f1-f4 respectively are combined together by the secondary inductors, the output signals having peaks at the frequencies f1-f4, respectively, are combined together; accordingly, the frequency characteristic of a wider bandwidth is realized, through the superposition of mutually different plural peaks.

Therefore, even in a case where the output frequency characteristic of each of the differential push-pull amplifiers PA1-PAn has a narrow band, by combining together all the output signals of these differential push-pull amplifiers PA1-PAn by the secondary inductors of the transformer, a power amplification circuit which has a wide band frequency characteristic can be realized.

Embodiment 2

Figure 4:
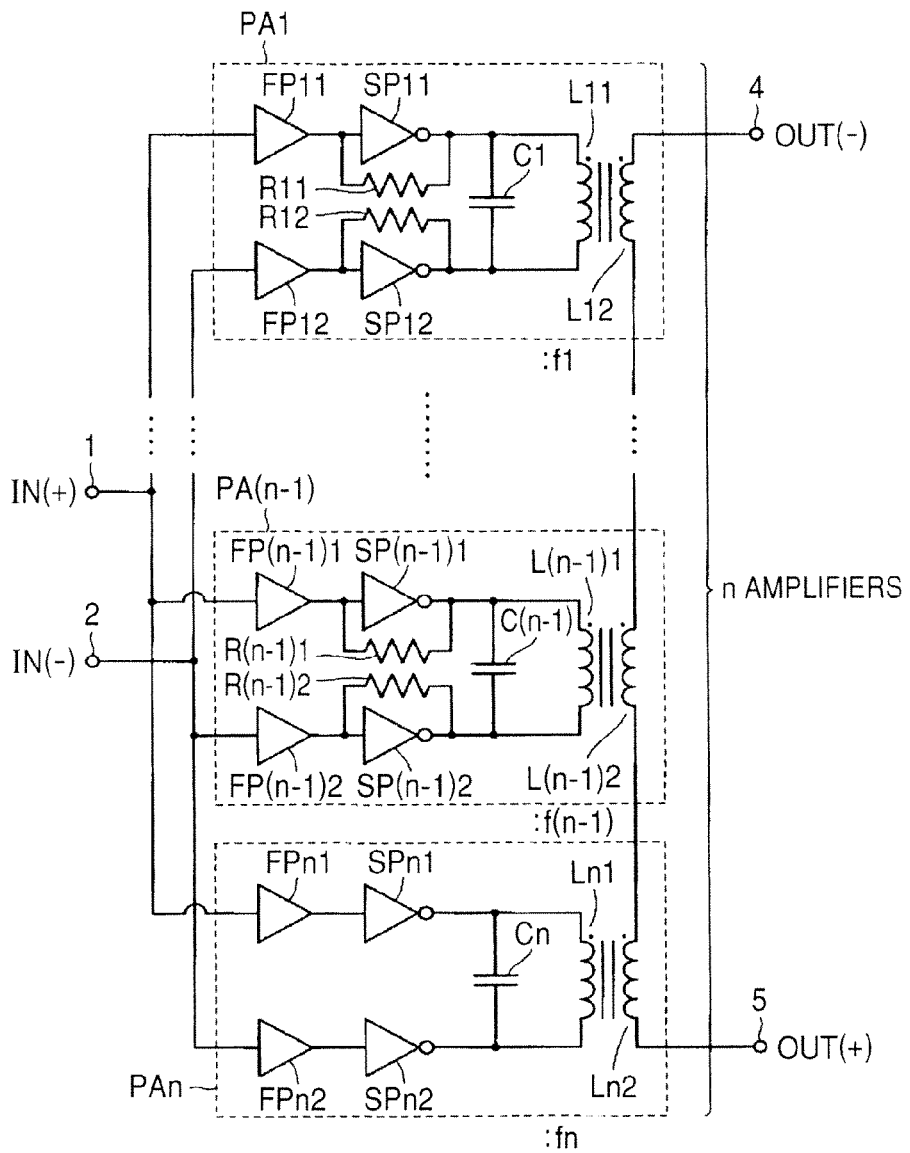
FIG. 4 is a drawing illustrating configuration of a power amplification circuit according to Embodiment 2 of the present invention.

FIG. 4 illustrates schematically configuration of a power amplification circuit according to Embodiment 2 of the present invention. The configuration of the power amplification circuit illustrated in FIG. 4 differs from the configuration of the power amplification circuit according to Embodiment 1 illustrated in FIG. 1 in the following points. That is, in each of the differential push-pull amplifiers PA1-PAn, amplifiers arranged to the input terminals 1 and 2 are formed respectively by a series body of a former-stage amplifier plus a succeeding-stage amplifier. Specifically, in the differential push-pull amplifier PA1, a series body of a former-stage amplifier FP11 plus a succeeding-stage amplifier SP11 is provided to the input terminal 1, and a series body of a former-stage amplifier FP12 plus a succeeding-stage amplifier SP12 is provided to the input terminal 2. In the differential push-pull amplifier PA(n−1), a series body of a former-stage amplifier FP(n−1)1 plus a succeeding-stage amplifier SP(n−1)1 is provided to the input terminal 1, and a series body of a former-stage amplifier FP(n−1)2 plus a succeeding-stage amplifier SP(n−1)2 is provided to the input terminal 2. In the differential push-pull amplifier PAn, a series body of a former-stage amplifier FPn1 plus a succeeding-stage amplifier SPn1 is provided to the input terminal 1, and a series body of a former-stage amplifier FPn2 plus a succeeding-stage amplifier SPn2 is provided to the input terminal 2.

All the former-stage amplifiers FP11, FP12-FP (n−1)1, FP(n−1)2, to FPn1, FPn2 have the same operating characteristic. The succeeding-stage amplifiers SP11, SP12-SPn1, SPn2 are formed by an inverting amplifier (negative phase amplifier), and have the same operating characteristic.

In the differential push-pull amplifiers PA1-PA(n−1), feedback resistors R11-R(n−1)1 are coupled between each output and input of the succeeding-stage amplifiers SP11-SP(n−1)1, and feedback resistors R12-R(n−1)2 are coupled between each output and input of the succeeding-stage amplifier SP12-SP(n−1)2. Such a feedback resistor is not provided in the succeeding-stage amplifiers SPn1 and SPn2 of the differential push-pull amplifier PAn.

In each of the differential push-pull amplifiers PA1-PA (n−1), the values of resistance of the feedback resistors Ra1 and Ra2 are equal, and the degree of negative feedback of the succeeding-stage amplifiers SPa1 and SPa2 is set equal. Here, "a" is one number of 1 to (n−1).

A capacitor Ci and a primary inductor Li1 of a transformer are coupled between the outputs of the succeeding-stage amplifiers SPi1 and SPi2 (i=1, . . . n). Arrangement of the transformer and the capacitor which perform output matching is the same as the configuration of the power amplifier illustrated in FIG. 1. Therefore, the same reference symbol is attached to a corresponding part, and the detailed explanation thereof is omitted. However, since the succeeding-stage amplifiers SP11, SP12-SPn1, SPn2 are inverting amplifiers (negative phase amplifiers), when the former-stage amplifiers FP11, FP12-FPn1, FPn2 are non-inverting amplifiers (positive phase amplifiers), a signal of reversed phase is outputted to the output terminals 4 and 5, compared with the case of Embodiment 1. That is, the output signal OUT(−) is outputted to the output terminal 4, and the output signal OUT(+) is outputted to the output terminal 5. Also in the present case, similarly to Embodiment 1, either of the output terminals 4 and 5 may be grounded, and a single phase signal may be generated from the other output terminal which is not grounded.

Generally, gain of an amplifier has frequency dependence due to the operating characteristic etc. of a transistor included therein, and decreases monotonically as the frequency increases toward an upper limit frequency. Therefore, an output signal at the frequency f1 of the differential push-pull amplifier PA1 tends to become greater than an output signal at the frequency f2 (>f1) of the differential push-pull amplifier PA2. Similarly, an output signal at the frequency f(n−1) of the differential push-pull amplifier PA(n−1) tends to become greater than an output signal at the frequency fn of the differential push-pull amplifier PAn.

In this case, when the output signals of the differential push-pull amplifiers PA1-PAn are simply combined together, the resultant output frequency characteristic shows that the output power decreases as the frequency becomes higher, as illustrated in FIG. 3.

In order to make such a frequency characteristic flat, what is necessary is just to suppress the outputs of the differential amplifiers PA1-PA(n−1) in accordance with the output of the differential push-pull amplifier PAn. The method to cope with the issue includes a method of coupling a series resistor to an input of an amplifier to attenuate an input signal, and a method of suppressing gain of an amplifier by negative feedback via a resistance element. In contrast to the attenuation of an input signal which only reduces an output of the amplifier, the negative feedback exhibits an effect to realize a wider bandwidth of the frequency characteristic of the amplifier in addition to gain suppression. Therefore, by realizing the wider bandwidth of the frequency characteristic of a single differential push-pull amplifier by negative feedback, it is possible to make flatter the frequency characteristic of the entire amplifier.

Specifically, feedback resistors R11, R12-R(n−1)1, R(n−1)2 are coupled to the succeeding-stage amplifiers SP11, SP12-SP (n−1) 1, SP(n−1)2, respectively, and negative feedback is applied to the input via the resistance element to these succeeding-stage amplifiers SP11, SP12-SP (n−1) 1, SP (n−1) 2; accordingly an output power is suppressed. By use of the scheme, the output gain of the differential push-pull amplifiers PA1-PA (n−1) is fitted to (is set approximately equal to) the output gain of the differential push-pull amplifier PAn which has the highest matching frequency, and the output frequency characteristic is made flat.

As a general trend, the value of resistance of negative feedback resistors Rk1 and Rk2 of a differential push-pull amplifier PAk becomes smaller than the value of resistance of the feedback resistors Rj1 and Rj2 of a push-pull amplifier PAj matched at frequency fj (>fk:j=k+1). In this case, the degree of negative feedback by the feedback resistors Rj1 and Rj2 of the succeeding-stage amplifiers SPj1 and SPj2 is made smaller than the degree of negative feedback applied to the succeeding-stage amplifiers SPk1 and SPk2. That is, the value of resistance of the feedback resistor is sequentially enlarged as the matching frequency becomes higher, and the degree of negative feedback is sequentially made smaller.

Since no feedback resistor is provided in the differential push-pull amplifier PAn matched at the frequency fn, the outputs of the differential push-pull amplifiers PA1-PA(n−1) are made smaller by applying negative feedback, so as to correspond to the output of the differential push-pull amplifier PAn of which the gain is the smallest. Since the outputs of the differential push-pull amplifiers PA1-PAn are combined together by a series body of the secondary inductors L12-Ln2, it is possible to make flat the frequency characteristic of the power amplification circuit which comprises these differential push-pull amplifiers PA1-PAn.

The values of resistance of the feedback resistors R11, R12-R(n−1)1, R(n−1)2 may be the same. When the power of the output signal is large, large negative feedback is applied and the degree that the output power is suppressed becomes large. The value of resistance of these negative feedback resistors may be suitably determined corresponding to the frequency dependence of the output power.

Modification

Figure 5:
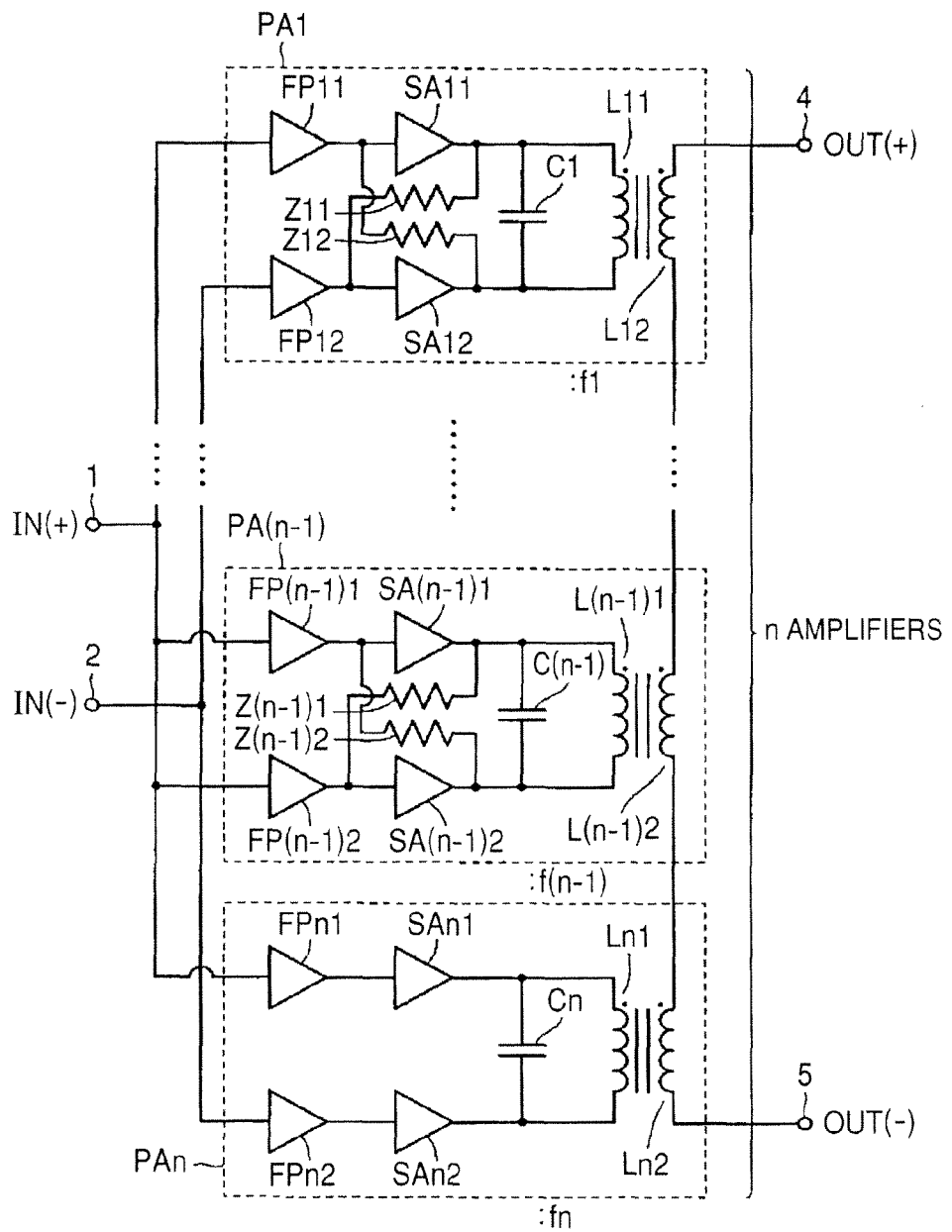
FIG. 5 is a drawing illustrating configuration of a power amplification circuit as a modified example of Embodiment 2 of the present invention.

FIG. 5 illustrates configuration of a modified example of a power amplification circuit according to Embodiment 2 of the present invention. The configuration of the power amplification circuit illustrated in FIG. 5 differs from the configuration of the power amplification circuit illustrated in FIG. 4 in the following points. That is, in each of the differential push-pull amplifiers PA1-PA(n−1), a non-inverting amplifier (positive phase amplifier) is utilized, as substitute for the inverting amplifier (negative phase amplifier). That is, succeeding-stage amplifiers SA11 and SA12 are provided in the differential push-pull amplifier PA1, and succeeding-stage amplifiers SA(n−1)1 and SA(n−1)2 are provided in the differential push-pull amplifier PA(n−1). Succeeding-stage amplifiers SAn1 and SAn2 are provided also in the differential push-pull amplifier PAn. Succeeding-stage amplifiers SAj1 and SAj2 are provided also in a not-shown differential push-pull amplifier PAj (j=2, . . . (n−2)). All of the succeeding-stage amplifiers SA11, SA12-SAn1, SAn2 have the same operating characteristic. The former-stage amplifiers FP11, FP12-FPn1, FPn2 have the same operating characteristic also.

In order to apply negative feedback to an output, in each of the differential push-pull amplifiers PA1-PA(n−1), the input and the output of the succeeding-stage amplifier are cross-coupled by a resistor. That is, in the differential push-pull amplifier PAi (i=1, (n−1)), a resistor Zi1 is coupled between the output of the succeeding-stage amplifier SAi1 and the input of the succeeding-stage amplifier SAi2, and a resistor Zi2 is coupled between the output of the succeeding-stage amplifier SAi2 and the input of the succeeding-stage amplifier SAi1. Relationship of the value of resistance of the feedback resistive elements Z11, Z12-Z(n−1)1, Z (n−1)2 is the same as that of the resistors R11, R12-R (n−1)1, R(n−1)2 in the power amplification circuit previously illustrated in FIG. 4.

The other configuration of the power amplification circuit illustrated in FIG. 5 is the same as that of the power amplification circuit illustrated in FIG. 4. Therefore, the same reference number is attached to a corresponding part, and the detailed explanation thereof is omitted. However, since a non-inverting amplifier (positive phase amplifier) is utilized as the succeeding-stage amplifier in each of the differential push-pull amplifiers PA1-PAn, output signals OUT (+) and OUT (−) are generated at the output terminals 4 and 5, respectively. The obtained output signals OUT (+) and OUT (−) are in phase with the input signals IN(+) and IN(−) supplied to the input terminals 1 and 2.

In the configuration of the power amplification circuit illustrated in FIG. 5, each of the differential push-pull amplifiers PA1-PA(n−1) amplifies, in the respective interior, the differential signals IN(+) and IN(−) which are supplied to the input terminals 1 and 2, generates the differential signals and drives the corresponding primary inductor. In the differential push-pull amplifier PAi, the output signal of the succeeding-stage amplifier SAi1 and the output signal of the succeeding-stage amplifier SAi2 are in reversed phase. Therefore, by providing the feedback resistors Zi1 and Zi2 in cross-coupling, it is possible to apply negative feedback to the inputs of the succeeding-stage amplifiers SAi1 and SAi2; accordingly, it is possible to suppress the output signal.

Therefore, also in the configuration illustrated in FIG. 5, by applying to each input negative feedback corresponding to the output, it is possible to control the output power almost the same, even in a case where each of the differential push-pull amplifiers PA1-PAn is matched at mutually different frequencies f1-fn. Accordingly, it is possible to obtain a flat frequency characteristic over a wide band.

Figure 6:
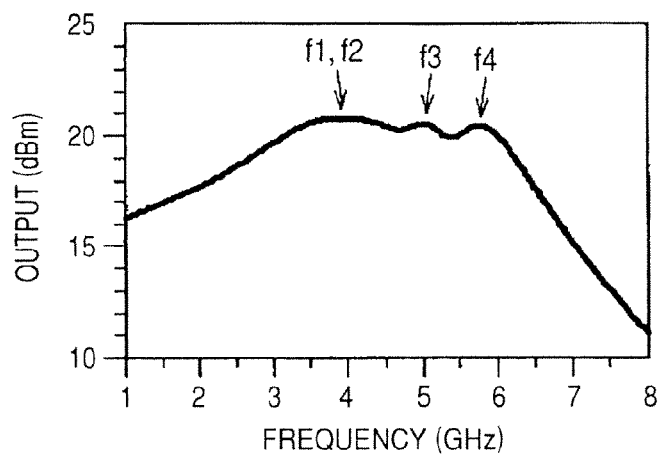
FIG. 6 is a drawing illustrating a simulation result of a frequency characteristic of the power amplification circuit according to Embodiment 2 of the present invention.

FIG. 6 illustrates a simulation result of a frequency characteristic of an output signal of the power amplification circuit according to Embodiment 2 of the present invention. In FIG. 6, the horizontal axis indicates a frequency (in units of GHz), and the vertical axis indicates an output (in units of dBm). As the simulation conditions, it is assumed that four differential push-pull amplifiers are employed and that a gain of a former-stage amplifier is one. The simulation is performed on the same conditions as the simulation illustrated in FIG. 3 except that a negative feedback resistance is added. The configuration of power amplification circuit illustrated in FIG. 5 exhibits a simulated frequency characteristic similar to the frequency characteristic of the power amplification circuit illustrated in FIG. 4 where the inverting amplifiers are utilized as the succeeding-stage amplifiers.

As illustrated in FIG. 6, compared with the output frequency characteristic illustrated in FIG. 3, three peaks in a lower frequency region (outputs corresponding to the frequencies f1-f3) are suppressed, resulting in a flatter frequency characteristic. Furthermore, a wider bandwidth of the frequency characteristic is realized by the negative feedback, for each single body of the differential push-pull amplifiers (PA1-PA3) corresponding to the frequencies f1-f3. In addition, a further flatter frequency characteristic is realized in the lower frequency region, because the amount of the negative feedback is larger in the lower frequency.

Some amplifiers, while performing an invertion-amplification in a low frequency region, may make the phase difference between an input signal and an output signal smaller than $\pi/2$ in a high frequency region, due to a parasitic component of the amplifiers. In such a case, the inverting amplifiers with such poor RF response characteristics are regarded as non-inverting amplifiers and the feedback resistors need to be coupled in cross as illustrated in FIG. 5 instead of FIG. 4.

As described above, according to Embodiment 2 of the present invention, a resistance element is coupled so that negative feedback may be applied to the output of the internal amplifier in the differential push-pull amplifiers other than the differential push-pull amplifier which is matched at the highest frequency. Accordingly, the output gain of each of the differential push-pull amplifiers is equalized, and it becomes possible to obtain a power amplification circuit which has a flat frequency characteristic over a wide band.

Embodiment 3

Figure 7:
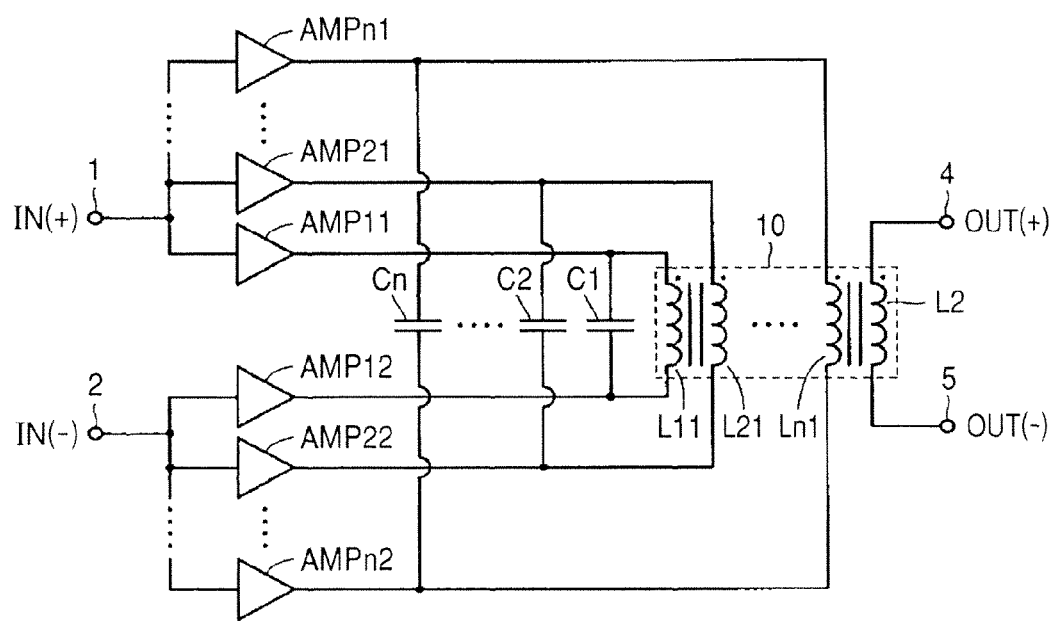
FIG. 7 is a drawing illustrating configuration of a power amplification circuit according to Embodiment 3 of the present invention.

FIG. 7 illustrates schematically configuration of a power amplification circuit according to Embodiment 3 of the present invention. In the power amplification circuit illustrated in FIG. 7, a transformer 10 which performs matching and combining of outputs of differential push-pull amplifiers is provided with primary inductors L11-Ln1 arranged in parallel and a secondary inductor L2 arranged in common to the primary inductors L11-Ln1. The secondary inductor 12 is coupled between output terminals 4 and 5.

Corresponding to the primary inductors L11-Ln1, capacitors C1-Cn, amplifiers AMP11-AMPn1, and amplifiers AMP12-AMPn2 are arranged similarly as in Embodiment 1 illustrated in FIG. 1. Since the primary inductors L11-Ln1 are arranged in parallel with each other in the present configuration, the amplifiers AMP11-AMPn1 coupled to the input terminal 1 and the amplifiers AMP12-AMPn2 coupled to the input terminal 2 are grouped respectively and arranged separately on one side of and on the other side of the transformer.

Also in the present configuration of the power amplification circuit illustrated FIG. 7, each differential push-pull amplifier includes amplifiers AMPi1 and AMPi2 in pair, and is matched at mutually different frequencies f1-fn.

Also in the configuration illustrated in FIG. 7, the primary inductors L11-Ln1 arranged in parallel with the same polarity are magnetically coupled to the secondary inductor L2 in common, therefore, the outputs of the differential push-pull amplifiers (PA1-PAn) are combined together by the secondary inductor L2, to realize a wide band frequency characteristic.

In the configuration illustrated in FIG. 7, the secondary inductor L2 is provided common to the primary inductors L11-Ln1 coupled to the plural differential push-pull amplifiers (PA1-PAn). Therefore, compared with the configuration in which plural secondary inductors are provided corresponding to each of the primary inductors L11-Ln1, and are coupled in series, the layout area of the transformer 10 can be reduced; therefore, when the power amplification circuit is formed by one chip, the chip area can be made small.

In an analog circuit, inductance is dependent on length, width, etc. of an inductor, therefore, it is difficult to realize high performance by process miniaturization. This fact applies equally to the transformer 10 as an output unit which includes inductors. Therefore, a large effect is expected for a chip area reduction by common use of the secondary inductor of the output-combining transformer to the plural differential push-pull amplifiers (PA1-PAn), and by reducing the occupied area of the transformer 10 to 1/n times substantially.

In the configuration of the power amplification circuit illustrated in FIG. 7, as in the configuration according to Embodiment 2, each differential push-pull amplifier may adopt a former-stage amplifier and a succeeding-stage amplifier arranged in series with a negative feedback resistive element, in lieu of the amplifiers AMPi1 and AMPi2. In the configuration, it is possible to realize a flat frequency characteristic similarly as in Embodiment 2.

In the power amplification circuit illustrated in FIG. 7, the primary inductors are disposed, from the left of the figure, in order from the primary inductor L11 having the matching frequency f1 to the primary inductor Ln1 having the highest matching frequency fn. However, the primary inductors may be disposed in the reversed order.

Figure 8:
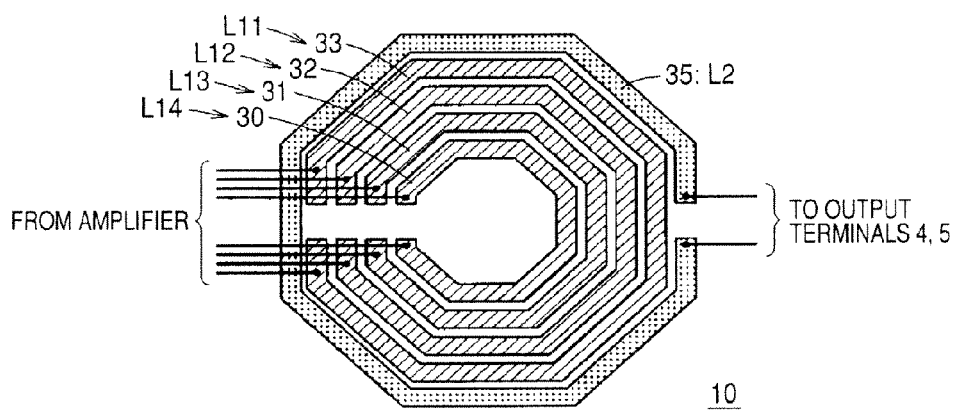
FIG. 8 is a drawing illustrating schematically an example of structure of a transformer employed in the power amplification circuit according to Embodiment 3 of the present invention.

FIG. 8 illustrates schematically an example of configuration of the transformer 10 employed in the power amplification circuit according to Embodiment 3 of the present invention. FIG. 8 illustrates arrangement of the inductors of the transformer 10 which corresponds to four differential push-pull amplifiers (PA1-PA4).

In FIG. 8, primary inductors 30-33 each having the shape of a loop with a part separated (separation ends) are arranged concentrically in order. Each of the loop-shaped primary inductors (inductor loop) 30-33 is formed by a metallic wiring with the same line width. A first separation end and a second separation end of each loop-shaped primary inductor are coupled to the output of a corresponding amplifier which generates a differential signal.

As for the loop-shaped primary inductors 30-33, the length is increased from the inside toward the outside in order. Accordingly, when the line width is equal, the inductance is increased in order from the loop-shaped primary inductor 30 to the loop-shaped primary inductor 33. Therefore, the innermost loop-shaped primary inductor 30 corresponds to the primary inductor L14 with the highest matching frequency, and the loop-shaped primary inductor 33 corresponds to the primary inductor L11 with the lowest matching frequency. An inductor (inductor loop) 35 of the shape of a loop with a part separated (separation ends) is arranged concentrically at the outer circumference of the loop-shaped primary inductor 33. Both separation ends of the loop-shaped secondary inductor 35 (L2) are arranged in an opposed position to the separation ends of each of the primary inductors 30-33, and are coupled to the output terminals 4 and 5, respectively.

In the arrangement illustrated in FIG. 8, the inductors are formed using metallic wiring and arranged in planar structure over the same substrate (chip), and inductance is determined corresponding to the length of the metallic wiring.

By arranging the separation ends of the loop-shaped primary inductors 30-33 and the separation ends of the loop-shaped secondary inductor 35 in opposed positions in line, wiring to the inductors 30-33 and to the inductor 35 can be arranged easily.

(An Example of Modification of a Transformer)

Figure 9:
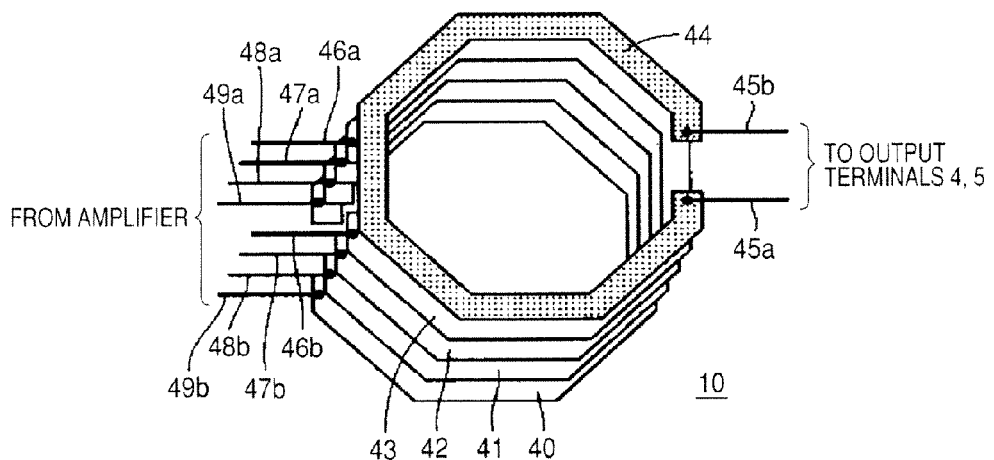
FIG. 9 is a drawing illustrating schematically structure of a transformer as a modified example, employed in the power amplification circuit according to Embodiment 3 of the present invention.

FIG. 9 illustrates schematically configuration of a transformer as a modified example, employed in the power amplification circuit according to Embodiment 3 of the present invention. The present configuration of the transformer 10 illustrated in FIG. 9 exemplifies also the case where four differential push-pull amplifiers are employed.

In FIG. 9, loop-shaped wirings 40-43 and 44, each having a part separated (separation ends), are arranged in lamination. The wirings 40-43 are utilized as primary inductors, and the separation ends are coupled to outputs of the corresponding amplifiers via signal wirings 46a, 46b-49a, 49b, respectively. On the other hand, the wiring 44 is utilized as a secondary inductor and the separated ends are coupled to the output terminals 4 and 5 via signal wirings 45a and 45b, respectively.

In the case of the configuration illustrated in FIG. 9, the wirings 40-43 utilized as the primary inductors and the wiring 44 utilized as the secondary inductor are laminated; accordingly, it is possible to reduce further a layout area of the transformer 10.

In FIG. 9, the wirings 40-43 have the identical shape, and their matching frequencies are adjusted with a capacitance value coupled in parallel with the respective wirings. The wirings 40-43 may have different shape, respectively.

In the configuration illustrated in FIGS. 8 and 9, it is necessary to take into consideration magnetic coupling among the primary inductors. Magnetic coupling among the primary inductors can be adjusted by the shape and the spacing of the wirings 40-43 utilized as the primary inductors, a position of the wiring 44 utilized as the secondary inductor, and a capacitance value of an individual capacitor coupled to each wiring. Here, a capacitor may be coupled also in the wiring 44 utilized as the secondary inductor.

As described above, in Embodiment 3 of the present invention, the secondary inductor of the output transformer of the plural differential push-pull amplifiers is provided in common to the plural differential push-pull amplifiers. Therefore, the arrangement surface area of the transformer for output matching and output combining can be reduced, and correspondingly, the layout area of the power amplification circuit can be reduced.

Embodiment 4

Figure 10:
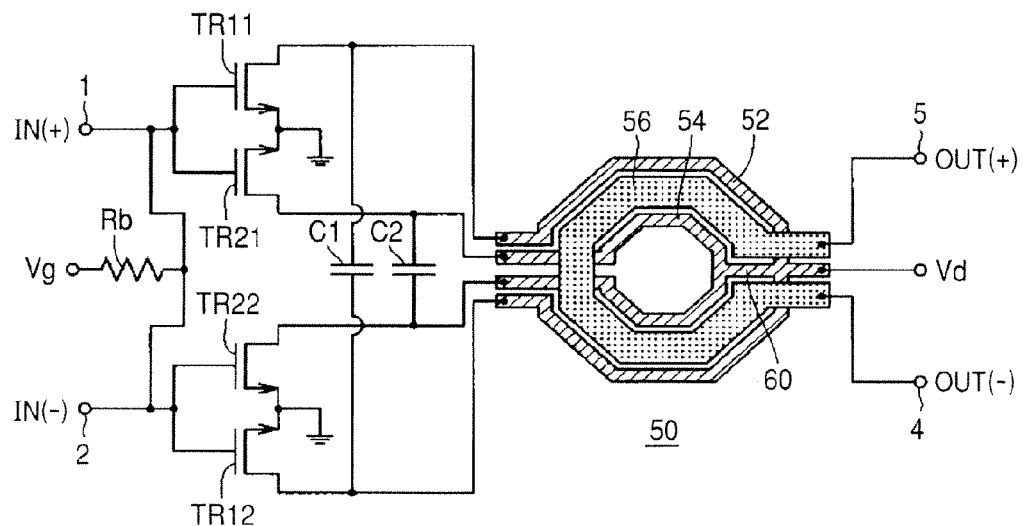
FIG. 10 is a drawing illustrating configuration of a power amplification circuit according to Embodiment 4 of the present invention.

FIG. 10 illustrates schematically configuration of a power amplification circuit according to Embodiment 4 of the present invention. Two differential push-pull amplifiers are used in the configuration of the power amplification circuit illustrated in FIG. 10.

In FIG. 10, the power amplification circuit includes N-channel MOS transistors (insulated-gate field effect transistors) TR11 and TR21 of which the gates are coupled to an input terminal 1, and N-channel MOS transistors TR12 and TR22 of which the gates are coupled to an input terminal 2. The sources of the MOS transistors TR11 and TR21 are grounded in common, and the sources of the MOS transistors TR12 and TR22 are grounded in common. The MOS transistors TR11, TR12, TR21, and TR22 operate as an amplification element respectively, and correspond to the amplifier AMP explained in the above described embodiments. A gate bias voltage Vg is supplied via a bias resistance Rb to the gates of the MOS transistors TR11, TR12, TR21, and TR22.

The present power amplification circuit further includes at least a capacitor C1 coupled between the drain nodes of the MOS transistors TR11 and TR12, a capacitor C2 coupled between the drain nodes of the MOS transistors TR21 and TR22, and a transformer 50 provided with a function of output combining and output matching.

The transformer 50 includes a primary inductor wiring 52 formed in the shape of a loop with one end separated, a primary inductor wiring 54 arranged inside the primary inductor wiring 52 and formed in the shape of a loop with one end separated, and a secondary inductor wiring 56 arranged between the primary inductor wirings 52 and 54, and formed in the shape of a loop with one end separated at a part in an opposed position to the separation ends of the primary inductors 52 and 54. The inductor wirings 52, 54, and 56 are arranged concentrically.

The separation ends of the primary inductor wiring 52 are coupled to the drain nodes of the MOS transistors TR11 and TR12, respectively, and the separation ends of the primary inductor wiring 54 are coupled to the drain nodes of the MOS transistors TR21 and TR22, respectively. The primary inductor wirings 52 and 54 are inter-coupled by a center tap wiring 60 at apart in an opposed position to the separation ends (a center point of the loop-shaped wiring), and drain bias voltage Vd is supplied via the wiring 60.

The secondary inductor wiring 56 has a wider line width than the primary inductor wirings 52 and 54. The separation ends of the secondary inductor wiring 56 are coupled to the output terminals 4 and 5, respectively.

Since the source-grounded MOS transistor is generally an inverting amplifier, an output signal OUT(−) is outputted to the output terminal 4, and an output signal OUT(+) is outputted to the output terminal 5. The separation ends of the primary inductor and the separation ends of the loop-shaped secondary inductor are arranged in the opposite direction. Therefore, when the polarity of a coil is defined by a starting end in the clockwise direction, the position relationship between the output terminal 4 and the output terminal 5 will become opposite to the arrangement illustrated in FIG. 1.

In the configuration of the power amplification circuit illustrated in FIG. 10, one differential push-pull amplifier is comprised of the MOS transistors TR11 and TR12, the capacitor C1, the primary inductor wiring 52, and the secondary inductor wiring 56, and another differential push-pull amplifier is comprised of the MOS transistor TR21 and TR22, the capacitor C2, the primary inductor wiring 54, and the secondary inductor wiring 56. Matching frequencies of the two differential push-pull amplifiers differ with each other. Since the length of the primary inductor wiring 54 is shorter than the primary inductor wiring 52, when the capacitance of the capacitors C1 and C2 is equal, the resonance frequency of a resonance circuit which is formed by the primary inductor wiring 54 and the capacitor C2 is higher than the resonance frequency of a resonance circuit which is formed by the primary inductor wiring 52 and the capacitor C1.

The line width of the secondary inductor wiring 56 is set several times (at least three times) wider than the line width of the primary inductor wirings 52 and 54, and fully suppresses magnetic coupling between the primary inductor wirings 52 and 54. In this case, it is effective that a spacing between the primary inductor wirings 52 and 54 is set as three or more times of the line width of the primary inductor wirings 52 and 54, from a viewpoint of not increasing the layout area of the transformer 50 so much but fully suppressing the magnetic coupling between the primary inductor wirings 52 and 54.

For example, in the case of a linear inductor wiring (slab inductor), when the wiring space is increased three times of the line width, a coupling coefficient will be reduced roughly by half compared with a case where the wiring space is very narrow.

In the configuration of the power amplification circuit illustrated in FIG. 10, the wiring 60 supplies the drain bias voltage Vd and functions as virtual AC grounding of each of the two differential push-pull amplifiers. Therefore, even if the primary inductor wirings 52 and 54 are inter-coupled by the wiring 60, no adverse influence is exerted on a signal generated by the primary inductor wirings 52 and 54, since the wiring 60 functions as the virtual AC grounding.

In the case of the power amplification circuit illustrated in FIG. 10 where two differential push-pull amplifiers are employed, although an effect of realizing a wider bandwidth of the frequency characteristic is reduced to some extent, chip area reduction effect can be enjoyed, magnetic coupling between the primary inductors can be reduced easily, and the design can be simplified.

In a differential push-pull amplifier, the asymmetry of the circuit arrangement may produce the asymmetry of parasitic components, and may become the cause of bringing about output reduction and/or distortion increase of the amplifier. However, in the configuration of the power amplification circuit illustrated in FIG. 10, it is possible to arrange the circuit to a mirror-image symmetry, with respect to a straight line which passes along the separation ends of the primary inductor wirings 52 and 54 and the separation ends of the secondary inductor wiring 56 of the transformer 50. Accordingly, it is possible to eliminate the problem such as output reduction and/or distortion increase.

The transformer 50 is also in mirror-image symmetry and the median points of the primary inductor wirings 52 and 54 act as the virtual AC grounding as described above. The median points of the primary inductor wirings 52 and 54 can be coupled by the center tap wiring 60, and the drain bias voltage Vd can be supplied from one end of the center tap wiring. Since the center tap wiring 60 acts as the virtual AC grounding, it is not necessary to provide an AC blocking coil for separating the primary inductor wirings 52 and 54 from a power source (Vd); accordingly, it is possible to simplify the structure of the transformer, and to reduce the layout area.

Modification

Figure 11:
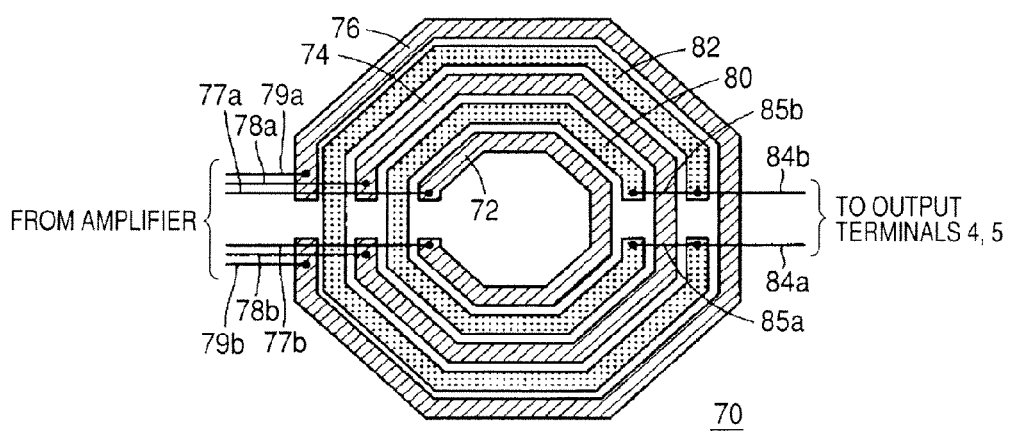
FIG. 11 is a drawing illustrating schematically structure of a transformer as a modified example, employed in the power amplification circuit according to Embodiment 4 of the present invention.

FIG. 11 illustrates schematically configuration of a transformer as a modified example, employed in the power amplification circuit according to Embodiment 4 of the present invention. In the configuration illustrated in FIG. 11, three differential push-pull amplifiers are provided in the power amplification circuit. In a transformer 70, loop-shaped primary inductor wirings 72, 74 and 76, each having a part separated (separation ends) and aligned in line, are arranged concentrically. A loop-shaped secondary inductor wiring 80 with a part separated (separation ends) is arranged between the primary inductor wirings 72 and 74. A loop-shaped secondary inductor wiring 82, with a part separated (separation ends) and aligned with the separation ends of the secondary inductor wiring 80, is arranged between the primary inductor wirings 74 and 76.

The separation ends of the primary inductor wiring 72 are coupled to outputs of the corresponding amplifier via signal wirings 77*a* and 77*b*, respectively. The separation ends of the primary inductor wiring 74 are coupled to outputs of the corresponding amplifier via signal wirings 78*a* and 78*b*, respectively. The separation ends of the primary inductor wiring 76 are coupled to outputs of the corresponding amplifier via signal wirings 79*a* and 797*b*, respectively.

The secondary inductor wirings 80 and 82 are short-circuited by signal wirings 84*a* and 84*h*, at short-circuiting parts 85*a* and 85*b* which are arranged in an opposed position to the separation ends of the primary inductor wirings 72, 74, and 76. The signal wirings 84*a* and 84*b* are coupled to the output terminals 4 and 5, respectively.

As illustrated in FIG. 11, magnetic coupling between the primary inductors can be made small by arranging each secondary inductor wiring between the primary inductor wirings. By short-circuiting the secondary inductor wirings 80 and 82 by the signal wirings 84*a* and 84*b* at the short-circuiting parts 85*a* and 85*b*, signals generated in the secondary inductor wirings 80 and 82 are combined together and transferred to the output terminals 4 and 5.

In the arrangement illustrated in FIG. 11, it is possible to realize configuration in which n differential push-pull amplifiers (n≥3) are employed, by arranging the primary inductor wiring and the secondary inductor wiring alternately.

In the arrangement of the transformer 70 illustrated in FIG. 11, by setting the line width of the secondary inductor wirings 80 and 82 as several times (preferably three or more times) wider than the line width of the primary inductor wirings 72, 74, and 76, magnetic coupling between the primary inductors can be further reduced, similarly as in the case where two differential push-pull amplifiers are employed, as illustrated in FIG. 10. However, the occupied area of the transformer increases in the present case.

Also in the configuration of the transformer 70 illustrated in FIG. 11, the drain bias voltage may be supplied at median points of the primary inductor wirings 72, 74, and 76, near the short-circuiting part 85*a* and 85*b*.

When two differential push-pull amplifiers are employed in the arrangement illustrated in FIG. 11, the transformer 70 may be formed using the primary inductor wirings 72 and 76, deleting the primary inductor wiring 74. Also in the present case, it is possible to maintain a sufficient broad spacing between the primary inductor wirings 72 and 76, with the help of the secondary inductor wirings 80 and 82, and it is possible to fully suppress magnetic coupling between the primary inductor wirings 72 and 76.

As described above, according to Embodiment 4 of the present invention, the loop-shaped secondary inductor wirings are arranged between the loop-shaped primary inductor wirings, and magnetic coupling between the primary inductor wirings can be reduced. Accordingly, the necessity of taking into consideration the magnetic coupling between the primary inductor wirings is reduced, and the design is simplified.

Embodiment 5

Figure 12:
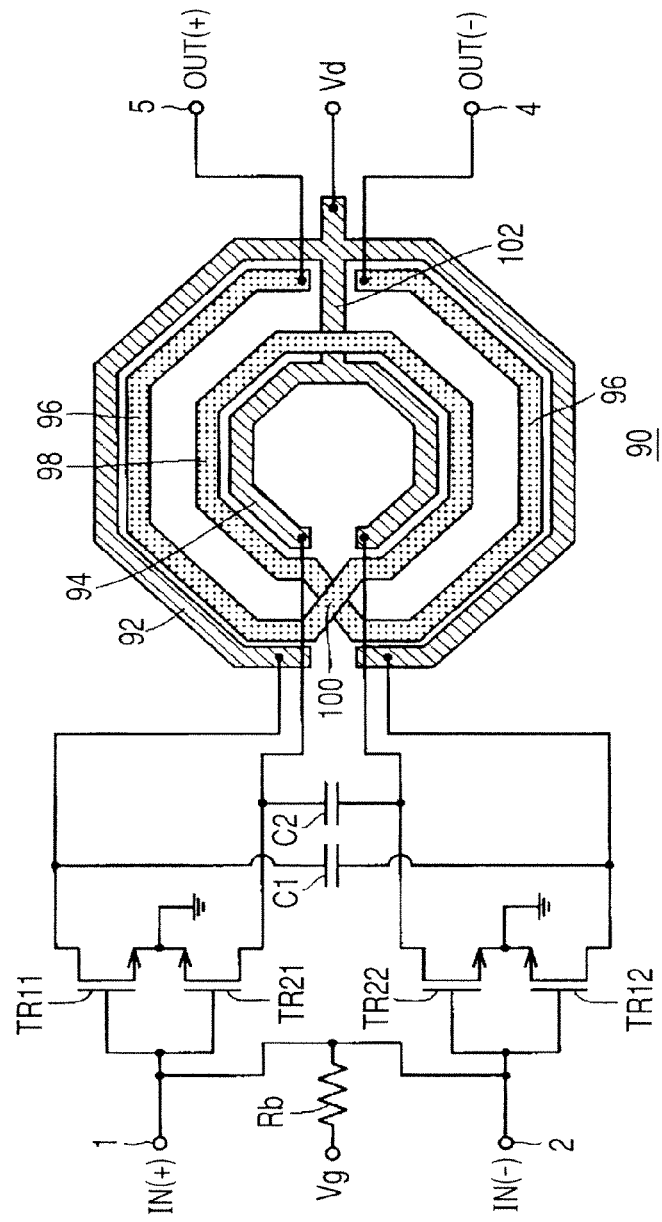
FIG. 12 is a drawing illustrating schematically configuration of a power amplification circuit according to Embodiment 5 of the present invention.

FIG. 12 illustrates schematically configuration of a power amplification circuit according to Embodiment 5 of the present invention. Although the power amplification circuit illustrated in FIG. 12 is different from the power amplification circuit illustrated in FIG. 10 in configuration of the transformer 90, but is the same in configuration of the amplifier. Therefore, the same reference number is attached to components pertaining to the amplifier, and the detailed explanation thereof is omitted.

In FIG. 12, the transformer 90 includes primary inductor wirings 92 and 94 formed in the shape of a loop with a part separated (separation ends), and secondary inductor wirings 96 and 98 arranged between the primary inductor wirings 92 and 94. The secondary inductor wirings 96 and 98 are coupled in series at a coupling area 100 arranged corresponding to the separation ends of the primary inductor wirings 92 and 94. The primary inductor wirings 92 and 94 are inter-coupled at the separation ends of the secondary inductor wiring 96 by a center tap wiring 102, and are supplied with drain bias voltage Vd.

In the configuration of the transformer 90 illustrated in FIG. 12, the primary inductor wirings 92 and 94 and the secondary inductor wirings 96 and 98 have the same line width. A spacing between the primary inductor wirings 92 and 94 is at least three times wider than the line width, and the magnetic coupling is rendered small. Since the secondary inductor wirings 96 and 98 are coupled in series, load resistance of each differential amplifier is divided and chip area reduction effect is realized, furthermore, it is possible to reduce drain voltage of the transistors TR11, TR12, TR21, and TR22 of the amplifier. (This is because a voltage twice as high as the applied voltage of the primary transformer wiring can be generated between the output terminals 4 and 5).

Also in a case where the spacing between the secondary inductor wirings 96 and 98 is narrowed, owing to the impedance conversion by the transformer 90 having the turn ratio 1:2 of the primary inductor and the secondary inductor, it is possible to obtain the output voltage four times as high as the input voltage, and as a result, it is possible to reduce drain voltage of the MOS transistors TR11, TR12, TR21, and TR22 of the amplifier.

The cross structure at the coupling area 100 of the secondary inductor wirings 96 and 98 may utilize the same configuration of the structure in the cross point of the secondary inductor wiring 98 and the center tap wiring 102. Namely, for example, in the coupling area 100, the configuration in which the secondary inductor wirings 98 and 96 are laminated through the intermediary of an insulator layer may be utilized.

As described above, according to Embodiment 5 of the present invention, the secondary inductor wiring is arranged between the primary inductor wirings, accordingly, it is possible to reduce magnetic coupling between the primary inductors, and is possible to provide a transformer having of a small amount of signal interference and a small occupied area.

In addition, by arranging and coupling in series the plural secondary inductor wirings, the drain voltage of a transistor of the amplifier can be reduced by a turn ratio of the primary inductor and the secondary inductor.

When applied to a power amplification circuit used in a field where a flat frequency characteristic is required over wide bands, such as a mobile communications field, the present invention can realize a power amplification circuit which has a wide band frequency characteristic by a simple circuit configuration. The differential push-pull amplifier may be integrated over a common substrate, or alternatively, the transformer may be formed over a common substrate, and components other than the transformer of the differential push-pull amplifier may be formed over another substrate.

What is claimed is:

1. A power amplification circuit comprising:
    first to fourth transistors having respective drains output signals and respective source coupled to a ground;
    a first primary inductor coupled between the drains of the first and second transistors;
    a second primary inductor coupled between the drains of the third and fourth transistors;
    a first capacitor coupled between one and another end of the first primary inductor;
    a second capacitor coupled between one and another end of the second primary inductor; and
    a secondary inductor magnetically coupled to the first and second primary inductors, wherein
    the first and third transistors are operative in response to a common first signal which is one of differential signals,
    the second and fourth transistors are operative in response to a common second signal which is another of the differential signals, and
    the secondary inductor outputs an amplified signal produced based on the differential signals.

2. The power amplification circuit according to claim 1, wherein the first and second primary inductors have different inductances.

3. The power amplification circuit according to claim 1, wherein the first and second capacitor have different capacitances.

4. The power amplification circuit according to claim 1, wherein the first and second capacitors and the first and second primary inductors are configured so that a matching frequency of an amplifier including the first transistor, the second transistors, the first capacitor and the first primary inductor is different from that of an amplifier including the third transistor, the fourth transistors, the second capacitor and the second primary inductor.

* * * * *